United States Patent
Nabeta et al.

[19]

[11] Patent Number: 4,704,413
[45] Date of Patent: Nov. 3, 1987

[54] RESIN COMPOSITION HAVING ELECTROMAGNETIC WAVE SHIELDING EFFECT

[75] Inventors: Takeshi Nabeta; Isamu Hanahara, both of Machida, Japan

[73] Assignee: Denki Kagaku Kogyo Kabushiki Kaisha, Tokyo, Japan

[21] Appl. No.: 820,493

[22] Filed: Jan. 17, 1986

Related U.S. Application Data

[63] Continuation of Ser. No. 720,194, Apr. 5, 1985, Pat. No. 4,604,413, which is a continuation of Ser. No. 645,938, Aug. 30, 1984, Pat. No. 4,602,051.

[30] Foreign Application Priority Data

| Sep. 7, 1983 | [JP] | Japan | 58-164353 |
| Sep. 14, 1983 | [JP] | Japan | 58-169909 |
| Dec. 2, 1983 | [JP] | Japan | 58-227019 |
| Dec. 28, 1983 | [JP] | Japan | 58-247068 |
| Mar. 10, 1984 | [JP] | Japan | 59-46277 |

[51] Int. Cl.$^4$ ............... G21F 1/10; G21K 1/10; C08K 9/02; C08K 7/06
[52] U.S. Cl. ............... 523/137; 252/503; 252/511; 523/210; 523/215

[58] Field of Search ............... 523/137, 210, 215; 252/503, 511

[56] References Cited

U.S. PATENT DOCUMENTS

| 3,575,903 | 4/1971 | Rombusch | 524/249 |
| 4,367,306 | 1/1983 | Maeda et al. | 523/137 |
| 4,566,990 | 1/1986 | Liu et al. | 523/137 |

FOREIGN PATENT DOCUMENTS

| 0071954 | 4/1983 | Japan | 523/215 |
| 0092354 | 5/1985 | Japan | 523/215 |

*Primary Examiner*—Herbert J. Lilling
*Attorney, Agent, or Firm*—Jordan and Hamburg

[57] ABSTRACT

According to the invention, a resin composition having an electromagnetic wave shielding effect is provided. The resin composition comprises 35 to 90 wt % of an ABS resin or a mixture of the ABS resin and an AS resin, 1 to 25 wt % of a plasticizer and 5 to 40 wt % of carbon fibers. The carbon fibers are uniformly dispersed in the resin ingredient without being broken or cut at the step of mixing and dispersing the resin components, thus exhibiting improved electromagnetic wave shielding effect.

18 Claims, 1 Drawing Figure

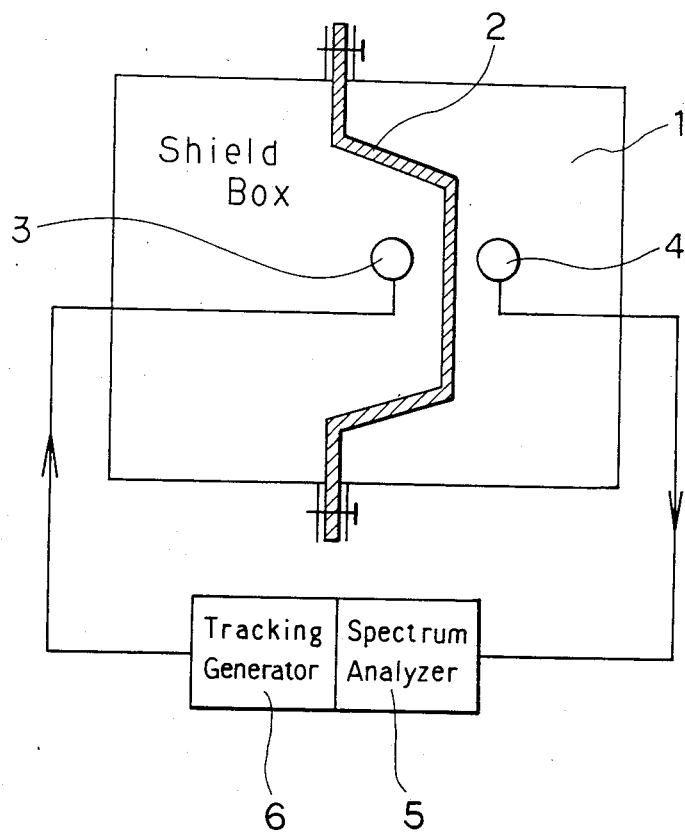

RESIN COMPOSITION HAVING ELECTROMAGNETIC WAVE SHIELDING EFFECT

This is a continuation of application Ser. No. 720,194, filed Apr. 5, 1985, which, in turn, is a continuation of application Ser. No. 645,938, filed Aug. 30, 1984.

BACKGROUND OF THE INVENTION

1. Field of the Invention

The present invention relates to a resin composition having an electomagnetic wave shielding effect, and more particularly to a resin composition for shielding the transmission of electromagnetic waves thereby to prevent disorders or trouble caused by electromagnetic waves.

2. Prior Art

In conventional systems, electronic instruments, such as business machines, electronic computers and television receivers, generate electromagnetic waves by themselves to cause malfunctions and/or noises in neighboring electronic instruments.

On the other hand, the electronic instruments are affected by the electromagnetic waves emitted from the adjacent electronic instruments, leading to malfunction thereof or generation of noises therefrom.

Troubles caused by the electromagnetic waves have been obviated to some extent when the housings of such electronic instruments are made of metal plates or aluminum die castings which can shield the transmission of electromagnetic waves.

However, plastic materials have been predominantly used for the housings of electronic instruments in recent years, because of the merits that they are easily molded to have various designs and that they are light in weight.

However, the plastic materials are generally poor in conductivity and have substantially no electromagnetic wave shielding effect. It is, thus, necessary to process the plastics materials to provide them with electromagnetic wave shielding effect when they are used for the housing of electronic instruments.

Particularly, in recent years, radiation of electromagnetic waves has been severely prohibited by domestic and foreign regulations. Under these circumstances, there is an increasing demand for plastic materials provided with electromagnetic wave shielding effects.

Various methods for providing the plastic materials with the electromagnetic wave shielding effect have hitherto been investigated, the known methods including application of an aluminum foil or a conductive tape, flame spraying with molten zinc, coating with a conductive paint, metal plating on the plastic materials, vacuum evaporation coating, spattering ion plating and molding a conductive plastic material containing a conductive filler.

However, the method of application of an aluminum foil or a conductive tape for the provision of electromagnetic wave shielding effect is not used practically, since it has the disadvantages that extreme skill is required and that it is not suited for housings having complicated shapes.

The method of flame spraying with molten zinc and the method of coating with a conductive paint have been predominantly used at the present time. However, these methods have the disadvantages that the thickness of the lining or coating becomes uneven when the housing has a complicated shape and that the adhesiveness of the lining or cooating to the substrate is insufficient, which results in exfoliation of the conductive layer, leading to the loss of the electromagnetic wave shielding effect or even causing a risk of fire.

Although the durability and adhesiveness of the metal plated on the plastics materials are satisfactory, only few kinds of plastic materials can be plated with metals and the articles to be plated are limited to those of small dimensions.

Satisfactory electromagnetic wave shielding effect can be provided by metal evaporation techniques including vacuum evaporation coating, spattering and ion plating. However, these techniques have not been applied for commercial scale production, since they require expensive apparatuses and skillful operations.

Contrary to the aforementioned methods wherein conductive layers are formed on the surfaces of molded plastic materials to provide the electromagnetic wave shielding effect, the molded products made of a composite conductive plastics material containing a conductive filler mixed and dispersed in a matrix plastic material is averted from the impairment of electromagnetic wave shielding effect or from the risk of fire caused by exfoliation of conductive layer.

However, the known conductive plastic molded articles have the disadvantages that satisfactory electromagnetic wave shielding effect cannot be obtained unless a large amount of conductive filler is added to the matrix plastic material, and that the physical properties of the resultant plastic material are deteriorated or the appearance of the molded article is impaired with serious increase in cost as the quantity of the filler added to the matrix plastic material is increased.

Particularly, as the amount of added conductive filler is increased, the dispersibility of the filler is lowered to result in uneven dispersion thereof. Especially when carbon fibers are used for the conductive filler, the fibers are broken during the kneading step to lower the electromagnetic wave shielding effect. If some part of the expensive carbon fibers is replaced by another inexpensive conductive filler in order to decrease the content of the carbon fibers, the fibrous and pulverized fillers present in the mixed condition become hardly dispersed in the matrix resin, leading to deterioration of moldability of the plastic material and deterioration of the properties of the molded articles. If the resultant plastic material is molded at a higher temperature in order to improve the moldability thereof, the matrix resin is decomposed or otherwise damaged so that the physical properties and the appearance of the molded articles are deteriorated and the coloring property of the resin becomes poor.

OBJECTS AND SUMMARY OF THE INVENTION

An object of this invention is to provide a resin composition having improved electromagnetic wave shielding effect, comprising a resin ingredient and carbon fibers which are uniformly dispersed in the resin ingredient and are not substantially broken or cut at the step of mixing and dispersing them.

Another object of this invention is to provide a resin composition having improved electromagnetic wave shielding effect and having improved fluidity and excellent moldability.

A further object of this invention is to provide a resin composition having improved electromagnetic wave shielding effect, which can be molded at a reasonably low melting temperature to avoid deterioration of physical properties, appearance and coloring property of the matrix resin.

A still further object of this invention is to provide a resin composition having improved electromagnetic wave shielding effect, which has a flame-retarding property and is improved in thermal and mechanical properties.

Yet a further object of this invention is to provide a resin composition, which has an extremely high electromagnetic wave shielding effect and may be colored freely.

The above and other objects of this invention will become apparent from the following description.

The resin composition having an electromagnetic wave shielding effect, according to the present invention, comprises 35 to 90 wt% of a compolymer of an ethylenic unsaturated nitrile, a diene rubber and an aromatic vinyl compound or a mixture of said copolymer with another copolymer of ethylenic unsaturated nitrile and an aromatic vinyl compound; 1 to 25 wt% of a plasticizer; and 5 to 40 wt% of carbon fibers.

BRIEF DESCRIPTION OF THE DRAWING

The single FIGURE appended to the specification is a schematic illustration showing the tester for the determination of the electromagnetic wave shielding effect of the plastic molded article made of the resin composition according to the invention.

DESCRIPTION OF THE INVENTION

The present invention will be described in detail hereinbelow.

The matrix resin for the resin composition having an electromagnetic wave shielding effect, according to the present invention, is a copolymer of an ethylenic unsaturated nitrile, a diene rubber and an aromatic vinyl compound or a mixture thereof with another copolymer of an ethylenic unsaturated nitrile and an aromatic vinyl compound.

The ethylenic unsaturated nitrile used in the invention includes, for example, acrylonitrile, methacrylonitrile, ethacrylonitrile and methyl methacrylonitrile. The particularly preferred are acrylonitrile and methacrylonitrile.

The diene rubber used in the invention includes one or more of conjugated 1,3-dienes, such as butadiene, isoprene, 2-chloro-1,3-butadiene, 1-chloro-1,3-butadiene and piperylene, which form rubbery polymers, the particularly preferred being butadiene.

The aromatic vinyl compound used in the invention includes, for example, styrene, α-methylstyrene, vinyltoluene, divinylbenzene and chlorostyrene, which may be used singly or in combination. A favorable result can be obtained, in the present invention, when styrene is used singly as the aromatic vinyl compound.

A more favorable result may be obtained when the copolymer of the ethylenic unsaturated nitrile, the diene rubber and the aromatic vinyl compound is a graft copolymer prepared by graft-copolymerizing 20 to 75 parts, preferably 20 to 60 parts, by weight of a diene rubber or a diene-containing polymer containing not less than 50 wt% of diene rubber with 80 to 25 parts, preferably 80 to 40 parts, by weight of a mixture of an ethylenic unsaturated nitrile and an aromatic vinyl compound.

If a mixture of a copolymer of ethylenic unsaturated nitrile, a diene rubber and an aromatic vinyl compound with another copolymer of an ethyleneic unsaturated nitrile and an aromatic vinyl compound is used, the mixing ratio of the former to the latter may range within 25 to 99 parts by weight of the former to 1 to 75 parts by weight of the latter, preferably within 35 to 65 parts by weight of the former to 65 to 35 parts by weight of the latter. If the mixing ratio is out of the aforementioned range, the moldability and the properties of the resultant composition are deteriorated. The process for the preparation of the copolymers and the mixture thereof are well-known in the art, and disclosed, for example, in the specification of Japanese Patent Publication No. 37675/1976. The description of the prior publication referred to above will be incorporated herein as a reference.

Specific examples of the plasticizers used in the composition of the invention include phthalic acid esters, such as dibutyl phthalate and di-2-ethylhexyl phthalate; fatty acid esters, such as di-2-ethylhexyl adipate, dibutyl sebacate, di-2-ethylhexyl sebacate and di-2-ethylhexyl azelate; epoxides, such as epoxidized fatty acid monoesters, epoxidized soybean oil and epoxidized linseed oil; phosphoric acid esters, such as tricresyl phosphate, tri-2-ethylhexyl phosphate and tributoxyethyl phosphate; ethers, such as triethyleneglycol di-2-ethyl butylate, dibutylcarbitol adipate and dibutylcarbitol formal; polyesters, such as adipic acid polyesters, sebacic acid polyesters and azelaic acid polyesters; and chlorinated plasticizers, such as chlorinated aliphatic esters and chlorinated paraffins. Particularly preferred plasticizers are phthalic acid esters, phosphoric acid esters and fatty acid esters.

When it is desired to provide the resin composition of the present invention with the flame-retarding property, a plasticizer selected from phosphoric acid derivatives and ethylene/propylene terpolymers is used.

Specific examples of the flame-retarding plasticizers of phosphoric acid derivatives are tri(2-ethylhexyl) phosphate, 2-ethylhexyl diphenyl phosphate, tributoxyethyl phosphate, triphenyl phosphate, cresyl diphenyl phosphate, isodecyl diphenyl phosphate, tricresyl phosphate, trixylenyl phosphate, mixed aryl phosphates, phenyl/isopropyl phenyl phosphate, mixed triaryl phosphates and tris(chloroethyl) phosphate. Particularly preferred results can be obtained by using 2-ethylhexyl diphenyl phosphate and tricresyl phosphate singly or in combination.

The best flame-retarding property may be obtained by using the ethylene/propylene terpolymer as the plasticizer in the resin composition of the invention. The ethylene/propylene terpolymer used as the plasticizer include copolymers of ethylene and propylene polymerized with a small amount of unsaturated compound as the third component. The terpolymer may be composed of 50 to 80 mol% of ethylene, 20 to 50 mol% of propylene and 0.5 to 10 mol% of an unsaturated third compound, and the most preferable composition contains 60 to 70 mol% of ethylene, 30 to 40 mol% of propylene and 0.5 to 5 mol% of an unsaturated third compound.

Dienes and/or trienes may be generally used as the third unsaturated compound, inter alia 1,4-hexadiene, dicyclopentadiene and ethylidene norbornene are particularly preferred because of their excellent copolymerizability and low cost.

The content of the plasticizer in the resin composition of the invention may range within 1 to 25 wt%, preferably within 2 to 15 wt%. If the content of the plasticizer is less than 1 wt%, the viscosity of the molten resin composition at the kneading step becomes so high as to cause breakdown of the carbon fibers and to result in insufficient dispersion of the fibers, thereby to lower the electromagnetic wave shielding effect and to deteriorate the moldability of the resultant resin composition. On the contrary, if the content of the plasticizer is more than 25 wt%, the physical properties including the resistance to heat of the resin composition are lowered and the molded products become sticky due to bleeding of the plasticizer. When the flame-retarding plasticizer is used, satisfactory flame-retarding effect cannot be expected if the content thereof is less than 1 wt%. When a phosphoric acid derivative is used as the flame-retarding plasticizer, particularly preferable content thereof ranges within 2 to 8 wt%. On the other hand, when the ethylene/propylene terpolymer is used as the plasticizer, particularly preferable content thereof ranges within 5 to 10 wt%.

One or a mixture of two or more of carbonized polyacrylonitrile fibers, carbonized pitch fibers and carbonized phenolic compound fibers may be used in the resin composition of the invention. Superior electromagnetic wave shielding effect can be attained by using the carbonized polyacrylonitrile fibers singly.

It is desirable that the length of individual carbon fiber be preferably in the range of from 0.5 to 20 mm, most preferably in the range of from 2 to 10 mm. If the length of individual fiber is less than 0.5 mm, the conductivity of the resin composition is lowered to an unsatisfactory level due to excessively small aspect ratio of the fibers. On the contrary, if the length of individual fiber is longer than 20 mm, the fluidity of the resin composition is extremely lowered to deteriorate the moldability thereof significantly with attendant deterioration of the appearance and mechanical properties of the molded products. In addition, the conductivity of the resin composition is rather lowered, since the fibers are not evenly dispersed throughout the composition. The carbon fibers may preferably have the diameters ranging within 3 to 25μ, more preferably within 5 to 12μ. The fibers are apt to be broken under the shearing action at the kneading step to lessen the aspect ratio of the fibers or to be entangled with each other to form fiber balls to lessen the dispersibility thereof, resulting in unsatisfactory conductivity of the resin composition, if the diameter of individual fibers is less than 3μ. On the contrary, if the diameter of individual fibers is more than 25μ, the conductivity of the resin composition becomes unsatisfactory since the aspect ratio of the fibers is too small. The bundle count of the carbon fibers may range preferably within 1,000 to 20,000, more preferably within 3,000 to 15,000. If the bundle count is less than 1,000, the bundled fibers are apt to be entangled with each other to form fiber balls to lessen the dispersibility thereof and to result in unsatisfactory conductivity of the resultant resin composition. On the contrary, if the bundle count is more than 20,000, the fiber bundles cannot be cloven effectively even by the shearing action at the kneading step, leading to uneven dispersion of the fibers to result in inferior conductivity of the resin composition.

When it is desired to provide the resin composition with especially high conductivity thereby to improve the electromagnetic shielding effect, carbon fibers with metallized surfaces may be used as the carbon fibers added to the matrix resin. Such carbon fibers may be produced by coating the surfaces of the carbon fibers with a metal, such as Ni, Cu or Al, by the plating, vacuum evaporation coating or spattering processes.

The content of the carbon fibers in the resin composition should range within 5 to 40 wt%, preferably 10 to 25 wt%. If the content thereof is less then 5 wt%, substantial electromagnetic wave shielding effect cannot be provided. On the contrary, if the content thereof exceeds 40 wt%, the resultant resin composition is hardly molded through extrusion or injection molding and the physical properties of the molded products are deteriorated.

In the present invention, a conductive carbon black may be added to the composition in addition to the aforementioned carbon fibers. Specific examples of the conductive carbon black include furnace black, channel black and the like such as S.C.F. (Super Conductive Furnace) black, E.C.F. (Electric Conductive Furnace) black, a by-product black such as "Ketchen Black" available from Nippon E.C. Co., Ltd. and acetylene black. It is preferred that the carbon black satisfies at least one of the following features of:
(1) having highly developed structure;
(2) having small particle size;
(3) having large specific surface area;
(4) Containing only a small amount of impurities which capture electrons; and
(5) having high degree of graphitization.

The preferable quantity of the carbon black added to the composition varies depending on the kind of the carbon black used, particularly on the specific surface area thereof, and may range within 2 to 30 wt%, more preferably 3 to 15 wt%. If the added amount of the carbon black is less than 2 wt%, the volume resistivity of the molded product becomes uneven to result in inferior electromagnetic wave shielding effect. On the contrary, if the added amount of the carbon black exceeds 30 wt%, the resin composition is hardly molded by extrusion or injection molding and the physical properties of the molded product become inferior.

An alkylamine antistatic agent may also be added to the resin composition. Preferable antistatic agents are amine compounds having hydroxyethyl groups and represented by the following formula of:

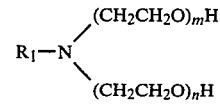

wherein $R_1$ is an alkyl or alkenyl group having 8 to 22 carbon atoms, and m and n are integers of 1 to 10.

The compounds set forth above are well-known in the art, and it is preferred to use those represented by the aforementioned formula wherein $2 \leq m+n \leq 10$.

Representative amine compounds having hydroxyethyl groups are N,N-bis(hydroxyethyl) tallow amine, polyoxyethylene lauryl amine and fatty acid esters of polyoxyethylene lauryl amine. Amongst them, N,N-bis(hydroxyethyl) tallow amine is the most preferred.

The amount of the added alkyl amine antistatic agent may range within 0.5 to 10 wt%, preferably 1 to 5 wt%. The effect of lowering the volume resistivity of the molded product cannot be expected when the added amount of alkyl amine antistatic agent if less than 0.5 wt% so that the electromagnetic wave shielding effect is not improved. On the contrary, if the amount of the added alkyl amine antistatic agent is more than 10 wt%, the resin composition is excessively lubricated to affect adversely the dispersibility of the carbon fibers at the compounding step so that the resin composition becomes hardly molded through extrusion or injection molding with attendant undesirable results that the physical properties and the electromagnetic wave shielding effect of the molded product become inferior.

A halogen-containing organic flame retarder and an auxiliary flame-retarding agent may also be added to provide the resin composition with potent resistance to catching fire. Specific examples of halogen-containing organic flame retarder include chlorinated paraffins, tetrabromobisphenol-A and oligomers thereof, decabromobiphenyl ethers, hexabromobiphenyl ethers, pentabromobiphenyl ethers, pentabromotoluene, pentabromoethylbenzene, hexabromobenzene, pentabromophenol, tribromophenol derivatives, perchloropentanecyclododecane, hexabromocyclododecane, tris(2,3-dibromopropyl-1)isocyanurate, tetrabromobisphenol-S and derivatives thereof, 1,2-bis(2,3,4,5,6-pentabromophenoxy)ethane, 1,2-bis(2,4,6-tribromophenoxy)ethane, brominated styrene oligomers, 2,2-bis-(4(2,3-dibromopropyl)-3,5-dibromophenoxy)propane, tetrachlorophthalic anhydride and tetrabromophthalic anhydride.

The auxiliary flame-retarding agents which may be used in the resin composition of the invention include antimony trioxide, sodium antimonate, zinc borate, and oxides and sulfides of zirconium and molybdenum, the most favourable result being obtained by the use of antimony trioxide.

The amount of the halogen-containing organic flame retarder added to the resin composition varies depending on the required degree of flame resistant property and also on the content of the flame-retarding plasticizer, and ranges generally from 2 to 35 wt%, preferably from 5 to 25 wt%.

The flame-retarding effect becomes insufficient if the amount of the added halogen-containing organic flame retarder is less than 2 wt%, whereas the thermal and mechanical properties of the molded product become inferior if the amount of added halogen-containing organic flame retarder exceeds 35 wt%.

The added amount of the auxiliary flame-retarding agent may be within 0.4 to 21 wt% and the ratio thereof to the halogen-containing organic flame retarder should be within the range of from 6/10 to 2/10, preferably from 5/10 to 3/10. Satisfactory synergistic effect of retarding the propagation of flame cannot be obtained if the added amount of the auxiliary flame-retarding agent is less than 0.4 wt%, whereas the mechanical properties of the molded product are deteriorated if the added amount of the auxiliary flame-retarding agent exceeds 21 wt%.

If the ratio of the auxiliary flame-retarding agent to the halogen-containing organic flame retarder is less than 2/10, synergistic flame-retarding effect cannot be realized to result in unsatisfactory flame-retarding function, whereas the mechanical properties of the molded product becomes inferior if the ratio of the former to the latter exceeds 6/10.

In order to further improve the properties of the resin composition of the invention, antioxidants, internal or external lubricants and stabilizers may be added thereto. Antioxidants which may be added to the resin composition of the invention include phenolic antioxidants, sulfur base antioxidants and phosphor base antioxidants. Specific examples of the phenolic antioxidants are 2,6-di-tert-butyl-p-cresol, 2,2'-methylenebis(4-methyl-6-tert-butyphenol), 4,4'-butylidenebis(3-methyl-6-tert-butylphenol), 4,4'-thiobis(3-methyl-6-tert-butylphenol), butylhydroxyanisole and tetrakis[methylene-3(3,5-di-tert-butyl-4-hydroxyphenyl)propionate]methane; the specific examples of the sulfur base antioxidants are dilauryl thiodipropionate, distearyl thiodipropionate, lauryl stearyl thiodipropionate, dimyristyl thiodipropionate and distearyl β,β'-thiodibutylate; and the specific examples of the phosphor base antioxidants are tridecyl phophite, diphenyl phenyl phosphite, triphenyl phosphite and trinonylphenyl phosphite. These antioxidants may be used singly or in combination. Decomposition or deterioration due to oxidation of the resin composition can be prevented by adding one or more of the aforementioned antioxidants, preferably, in an amount of 0.01 to 4 parts by weight to 100 parts by weight of the resin composition.

The internal or external lubricants which may be added to the resin composition of the invention include paraffins and hydrocarbon resins, such as paraffin waxes, liquid paraffins, paraffin base synthetic waxes and polyethylene waxes; fatty acids, such as stearic acid and hydroxystearic acid; fatty acid amides, such as stearoamide, oxystearoamide, oleyl amide, methylenebisstearoamide and methylenebisbehenamide; fatty acid esters, such as n-butyl stearate, methyl hydroxystearate and esters of saturated fatty acids; fatty acid alcohols, such as higher alcohols, and esters of higher alcohols; and partial esters of fatty acids and polyhydric alcohols, such as esters of glycerine and fatty acids, triglyceride of hydroxystearic acid and esters of sorbitan and fatty acids. One or a mixture of two or more of the internal or external lubricants set forth above may be used.

The stabilizers which may be added to the resin composition of the invention include metallic soaps, salts of inorgnic acids, organic tin compounds and composite stabilizers. Specific examples of the metallic soaps are zinc stearate, calcium stearate, zinc laurate and cadmium 2-ethylhexoate; examples of the salts of inorganic acids being tribasic lead sulfate, basic lead sulfite and lead-barium compounds; examples of the organic tin compounds being dibutyl tin laurate, dibutyl tin dimaleate, and di-n-octyl tin maleate polymers; and examples of the composite stabilizers are calcium-zinc base stabilizers, barium-lead base stabilizers and cadmium-barium-zinc base stabilizers. These stabilizers may be used singly or in combination.

Any one or more of the aforementioned internal and/or external lubricants and/or stabilizers may be added to the resin composition, preferably, in a ratio of 0.01 to 4 parts by weight to 100 parts by weight of the resin composition to improve the fluidity of the resin composition at the molding step and to prevent decomposition or deterioration of the resinous ingredient.

The process for the preparation of the resin composition of the invention will now be described. The copolymer of an ethylenic unsaturated nitrile, a diene rubber and an aromatic vinyl compound may be in the form of powder, beads or pellets. The copolymer or mixture thereof with another copolymer of an ethylenic unsaturated nitrile and an aromatic vinyl compound is mixed with the plasticizer and the carbon fibers and optionally with other ingredients. In order to improve the moldability of resin composition and to improve the properties of the molded products, it is preferred that the ethylenic unsaturated nitrile/diene rubber/aromatic vinyl compound copolymer be in the form of powder and the ethylenic unsaturated nitrile/aromatic vinyl compound copolymer be in the form of bead. In order to make uniform or homogenize the resin composition, the mixture is mixed and kneaded using a kneader or extruder, such as a Banbury mixer, cokneader, single spindle extruder or double spindle extruder. The mixture may be subjected to pre-mixing process using a tumbler or high speed mixer prior to the mixing and kneading step.

The mixed and kneaded resin composition is then charged in a hopper of an injection molding machine to be melted in a plasticizing cylinder of the injection molding machine, and the molten resin composition is injected into a mold and then cooled to be solidified. Solidified molded mass is removed from the mold to obtain an injection molded article made of the resin composition of the invention. Likewise, the mixed and kneaded resin composition is charged in a hopper of an extuder to be melted in a plasticizing cylinder of the extruder, and the molten resin composition is extruded through a die attached to the end of the extruding cylinder to form an extruded product made of the resin composition of the invention.

EXAMPLES OF THE INVENTION

The present invention will now be described more specifically by referring to Examples thereof.

EXAMPLES 1 to 8

A powder-form ABS resin (acrylonitrile/butadiene/styrene copolymer resin) having a composition composed of 10 wt% of acrylonitrile, 50 wt% of butadiene and 40 wt% of styrene and a bead-form AS resin (acrylonitrile/styrene copolymer resin) having a composition composed of 30 wt% of acrylonitrile and 70 wt% of styrene were used. A plasticizer available from Kao Soap Co., Ltd. under the Trade Name "VYNYCIZER #80" was used as the plasticizer in the resin composition. Carbonized polyacrylonitrile (referred to as "PAN" in the following Tables) chopped strands (Length: 6 mm, Diameter: 7$\mu$ Bundle Count: 12,000) available from Toho Rayon Co., Ltd. under the Trade Name "BESFIGHT HTAC6S" were used as the carbon fibers. One part, by weight, for each of an antioxidant and zinc stearate were added to 100 parts, by weight, of the resin. The compositions are shown in Table 1. Each of the compositions was put into a Banbury mixer heated to 140° C. to be mixed and kneaded until the temperature of the mixture reached 190° C.. Immediately after the mixture was discharged from the mixer, it was rolled through mixing rollers to form a sheet which was cooled and then crushed into pellets.

The thus formed pellets were charged in a hooper of an 8-ounce injection molding machine to be melted in a plasticizing cylinder of the machine, and then injected into a mold.

The mold was one provided with a 2 mm direct gate for molding a housing 15 cm square and having an wall thickness of 3 mm.

The thus molded products had excellent physical properties, improved resistance to heat and improved electromagnetic wave shielding effect, as shown in Table 1.

EXAMPLES 9 to 11

Each of the compositions set forth in Table 1 was pelletized similarly to Example 1, and charged in a hopper of an extruder having a cylinder of 40 mm in diameter (L/D=24) to be melted therein at 200° C. The molten mass was allowed to pass through a die for molding a single layer sheet.

The die had a width of 600 mm and the lip gap was adjusted to 3.5 mm. As the result, a single layer sheet having a thickness of 3 mm was formed.

The thus formed single layer sheets had excellent physical properties, improved resistance to heat and improved electromagnetic wave shielding effect, as shown in Table 1.

EXAMPLES 12 and 13

A powder-form MBS resin (methacrylonitrile/butadiene/styrene copolymer resin) composed of 50 wt% of methyacrylonitrile, 10 wt% of butadiene and 40 wt% of styrene was used in place of the powder-form acrylonitrile/butadiene/styrene copolymer resin. Other ingredients used in the compositions were the same as used in Example 1. The compositions were pelletized similarly to Example 1 and then subjected to injection molding to form molded products. The properties of the molded products were tested to reveal that they were improved in physical properties, resistance to heat and electromagnetic wave shielding effect, as shown in Table 1.

EXAMPLE 14

A pellet-form ABS resin (acrylonitrile/butadiene/styrene copolymer resin) composed of 20 wt% of acrylonitrile, 20 wt% of butadiene and 60 wt% of styrene was used in place of the ABS resin as used in Example 1 to prepare the resin composition shown in Table 1. The resin composition was pelletized similarly to Example 1 and subjected to injection molding to form a molded product. The properties of the molded product were tested to reveal that it had excellent physical properties, improved resistance to heat and improved electromagnetic wave shielding effect.

COMPARATIVE EXAMPLES 1 and 2

Injection molded products were produced from the compositions set forth in Table 2 in accordance with the procedures similar to Example 1, except in that one composition contained a plasticizer in an amount of less than the range defined in the claims whereas the other composition contained the plasticizer in an amount more than the defined range.

The properties of the injection molded products were tested. The results are shown in Table 2.

COMPARATIVE EXAMPLES 3 and 4

Injection molded products were produced from the compositions set forth in Table 2 in accordance with the procedures similar to Example 1, except in that one composition contained carbon fibers in an amount of less than the range defined in the claims whereas the other composition contained carbon fibers in an amount more than the defined range.

The properties of the injection molded products were tested. The results are shown in Table 2.

TABLE 1

| | Example No. | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Composition | | | | | | | | | | | | | | |
| Resin | | | | | | | | | | | | | | |
| Powder-Form ABS Resin (wt %) | 32 | 30 | 29 | 31 | 30 | 28 | 30 | 28 | 30 | 30 | 28 | — | — | — |
| Powder-form MBS Resin (wt %) | — | — | — | — | — | — | — | — | — | — | — | 30 | 29 | — |
| Bead-form AS Resin (wt %) | 48 | 45 | 44 | 47 | 45 | 42 | 45 | 42 | 45 | 45 | 42 | 45 | 44 | — |
| Pellet-form ABS Resin (wt %) | — | — | — | — | — | — | — | — | — | — | — | — | — | 75 |
| Plasticizer | | | | | | | | | | | | | | |
| Di-2-ethylhexyl Phthalate (wt %) | 5 | 10 | 12 | — | — | — | 5 | 10 | 10 | — | 10 | 10 | 12 | 10 |
| Adipic Acid Polyester (wt %) | — | — | — | 7 | 10 | 15 | — | — | — | 10 | — | — | — | — |
| Carbon Fibers PAN Chopped Strand (wt %) | 15 | 15 | 15 | 15 | 15 | 15 | 20 | 20 | 15 | 15 | 20 | 15 | 15 | 15 |
| Property | | | | | | | | | | | | | | |
| Electromagnetic Wave Shielding Effect (dB) | 30 | 40 | 45 | 35 | 40 | 50 | 40 | 50 | 35 | 35 | 40 | 40 | 45 | 20 |
| Tensile Strength (kg/mm$^2$) | 3.7 | 3.6 | 3.5 | 4.1 | 4.0 | 3.9 | 2.9 | 2.7 | 4.0 | 4.4 | 3.0 | 4.0 | 3.8 | 3.3 |
| Bending Strength (kg/mm$^2$) | 5.5 | 5.4 | 5.3 | 6.0 | 5.9 | 5.8 | 4.3 | 4.5 | 5.9 | 6.5 | 5.0 | 5.9 | 5.8 | 4.9 |
| Bending Modulus of Elasticity (kg/mm$^2$) | 260 | 240 | 220 | 270 | 260 | 250 | 290 | 280 | 260 | 290 | 310 | 260 | 270 | 240 |
| Izod Impact Strength (kg-cm/cm) | 18 | 20 | 22 | 17 | 18 | 21 | 16 | 15 | 22 | 20 | 17 | 16 | 18 | 18 |
| Vicat Softening Point (°C.) | 80 | 75 | 72 | 82 | 80 | 75 | 80 | 75 | 75 | 80 | 75 | 85 | 82 | 80 |

TABLE 2

| | Comparative Example | | | |
|---|---|---|---|---|
| | 1 | 2 | 3 | 4 |
| Composition | | | | |
| Resin | | | | |
| Powder-form ABS Resin (wt %) | 33.8 | 22 | 35.2 | 16 |
| Powder-form MBS Resin (wt %) | — | — | — | — |
| Bead-form AS Resin (wt %) | 50.7 | 33 | 52.8 | 24 |
| Pellet-form ABS Resin (wt %) | — | — | — | — |
| Plasticizer | | | | |
| Di-2-ethylhexyl Phthalate (wt %) | 0.5 | 30 | 10 | 10 |
| Adipic Acid Polyester (wt %) | — | — | — | — |
| Carbon Fibers PAN Chopped Strand (wt %) | 15 | 15 | 2 | 50 |
| Electromagnetic Wave Shielding Effect (dB) | 12 | 40 | 5> | 55 |
| Property | | | | |
| Tensile Strength (kg/mm$^2$) | 4.5 | 2.7 | 4.4 | 1.6 |
| Bending Strength (kg/mm$^2$) | 6.5 | 4.5 | 6.5 | 2.3 |
| Bending Modulus of Elasticity (kg/mm$^2$) | 300 | 220 | 230 | 280 |
| Izod Impact Strength (kg-cm/cm) | 12 | 22 | 24 | 10 |
| Vicat Softening Point (°C.) | 95 | 50 | 75 | 75 |

The properties of the molded products set forth in Tables 1 and 2 and throughout the other Examples and Comparative Examples were determined by the following test methods.

(1) Electromagnetic Wave Shielding Effect:

Using the tester for the determination of electromagnetic wave shielding effect as shown in the appended drawing, the effects of respective molded articles were determined through the DENKA method. In detail, a plastic molded article 2 was mounted in a shield box 1 so that the tested article 2 traversed the box 1 to separate the latter into two sections, a high frequency wave emitter antenna 3 being contained in one section and a receiver antenna 4 being contained in the other section. The high frequency wave emitter antenna 3 was connected to a tracking generator 6 which was energized to generate high frequency wave of a predetermined voltage. The wave passing through the traversing article 2 was received by the receiver antenna 4. The voltage of the wave passing through the article 2 and received by the receiver antenna 4 was compared with the voltage of the wave emitted from the emitter antenna 3 to determine the electromagnetic wave shielding effect of the article 2.

(2) Tensile Strength:

Tensile strengths of respective molded articles were determined generally in accordance with the JIS K-6871 Method.

(3) Bending Strength & Bending Modulus of Elasticity:

These values were determined generally in accordance with the ASTM D-790 Method.

(4) Izod Impact Strength (with Notch):

Izod impact strengths of respective molded articles were determined generally in accordance with the JIS K-6871 Method.

(5) Vicat Softening Point:

Vicat softening points of respective molded articles were determined generally in accordance with the JIS K-7206 Method.

EXAMPLES 15 to 29

The powder-form ABS resin (acrylonitrile-/butadiene/styrene copolymer resin) as used in Example 1 and the bead-form AS resin (acrylonitrile/styrene copolymer resin) as used in Example 1 were used. The same plasticizer and the same carbon fibers as used in Example 1 were used.

The carbon black used was the one available from Cabot Corp. under the Trade Name "VULCAN XC-72" which had a DBP oil absorption of about 180 cm$^3$/100 g, an N$_2$ specific surface area of about 180 m$^2$/g and a particle size of about 30 μm. An alkyl amine antistatic agent available from Kao Soap Co., Ltd. under the Trade Name "ELECTRO STRIPPER-EA" was used as the antistatic agent.

Each of the compositions set forth in Table 3 was further added with an antioxidant and zinc stearate, and put into a Banbury mixer heated to 140° C. to be melted and kneaded. Immediately after the temperature of the kneaded mixture reached 190° C., the mixture was discharged from the mixer and rolled between mixing rollers into a sheet, which was cooled and then crushed into pellets.

The pellets were charged in a hopper of an 8-ounce injection machine to be melted in the plasticizing cylinder of the machine, and the molten mass was injected into a mold.

The mold was provided with a 2 mmφ direct gate for molding a housing 15 cm square and having a wall thickness of 3 mm.

The thus molded products had excellent physical properties, improved resistance to heat and improved electromagnetic wave shielding effect, as shown in Table 3.

EXAMPLES 30 AND 34

Each of the compositions as set forth in Table 4 was pelletized in accordance with the procedures similar to Example 1, and charged in a hopper of an extruder having a cylinder of 40 mm in diameter (L/D=24) to be melted in the cylinder. The molten composition in the cylinder was then extruded through a die for molding a single layer sheet, the die being maintained at 200° C.

The die had a width of 600 mm and a lip gap of 3.5 mm. As the result of extrusion, a single layer sheet having a thickness of 3 mm was formed.

The thus formed single layer sheet had excellent physical properties, improved resistance to heat and improved electromagnetic wave shielding effect, as shown in Table 4.

EXAMPLES 35 TO 36

A powder-form MBS resin (methacrylonitrile/butadiene/styrene copolymer resin) composed of 50 wt% of methacrylonitrile, 10 wt% of butadiene and 40 wt% of styrene was used in place of the powder-form acrylonitrile/butadiene/styrene copolymer resin used in Example 1. The composition as set forth in Table 4 were pelletized generally following the procedures as described in Example 1. Injection molded products were produced from the thus prepared pellets. The properties of the molded products were tested to reveal that they had improved physical properties, improved resistance to heat and improved electromagnetic wave shielding effect.

EXAMPLE 37

A pellet-form ABS resin (acrylonitrile/butadiene/styrene copolymer resin) composed of 20 wt% of acrylonitrile, 20 wt% of butadiene and 60 wt% of styrene was used. The composition as set forth in Table 4 was pelletized generally following the procedures as described in Example 1. An injection molded product was formed from the pellets and subjected to tests. The results of the tests revealed that the molded product had improved physical properties, improved resistance to heat and improved electromagnetic wave shielding effect.

COMPARATIVE EXAMPLES 5 AND 6

Generally following the procedures as described in Example 1, injection molded products were produced from the compositions as set forth in Table 4, one composition containing the plasticizer in an amount less than the range defined in the appended claims whereas the other composition containing the plasticizer in an amount more than the defined range. The properties of the injection molded products are shown in Table 4. As shown, the product of Comparative Example 5 is inferior in electromagnetic wave shielding effect due to inadequate dispersion of carbon fibers, and the product of Comparative Example 6 is inferior in resistance to heat due to excessively high content of plasticizer.

COMPARATIVE EXAMPLES 7 AND 8

Generally following to the procedures as described in Example 1, injection molded products were produced from the compositions as set forth in Table 4, one composition containing carbon fibers in an amount less than the range defined in the appended claims whereas the other composition containing carbon fibers in an amount more than the defined range. The properties of the injection molded products are shown in Table 4. As shown, the product of Comparative Example 7 has an inferior electromagnetic wave shielding effect, whereas the product of Comparative Example 8 has a low impact strength.

TABLE 3

| | Example No. | | | | | | | | | | | | | | |
|---|---|---|---|---|---|---|---|---|---|---|---|---|---|---|---|
| | 15 | 16 | 17 | 18 | 19 | 20 | 21 | 22 | 23 | 24 | 25 | 26 | 27 | 28 | 29 |
| Composition | | | | | | | | | | | | | | | |
| Resin | | | | | | | | | | | | | | | |
| Powder-Form ABS Resin (wt %) | 32 | 30 | 29 | 31 | 30 | 28 | 28 | 26 | 25 | 30 | 29 | 27 | 31 | 29 | 28 |
| Powder-form MBS Resin (wt %) | — | — | — | — | — | — | — | — | — | — | — | — | — | — | — |
| Bead-form AS Resin (wt %) | 48 | 45 | 44 | 47 | 45 | 42 | 42 | 39 | 38 | 45 | 43 | 40 | 47 | 44 | 43 |
| Pellet-form ABS Resin (wt %) | — | — | — | — | — | — | — | — | — | — | — | — | — | — | — |
| Plasticizer | | | | | | | | | | | | | | | |
| Di-2-ethylhexyl Phthalate (wt %) | 5 | 10 | 12 | — | — | — | 5 | 10 | 12 | 7 | 10 | 15 | 5 | 10 | 12 |
| Adipic Acid Polyester (wt %) | — | — | — | 7 | 10 | 15 | — | — | — | — | — | — | — | — | — |
| Carbon Fibers PAN Chopped Strand (wt %) | 10 | 10 | 10 | 10 | 10 | 10 | 20 | 20 | 20 | 10 | 10 | 10 | 10 | 10 | 10 |
| Carbon Black VULCAN XC-72 (wt %) | 3 | 3 | 3 | 3 | 3 | 3 | 3 | 3 | 3 | 6 | 6 | 6 | 3 | 3 | 3 |
| Antistatic Agent Alkyl Amine Base (wt %) | 2 | 2 | 2 | 2 | 2 | 2 | 2 | 2 | 2 | 2 | 2 | 2 | 4 | 4 | 4 |
| Electromagnetic Wave Shielding Effect (dB) | 50 | 60 | 65 | 55 | 60 | 65 | 70 | 80 | 85 | 65 | 70 | 75 | 60 | 70 | 75 |
| Property | | | | | | | | | | | | | | | |
| Tensile Strength (kg/mm$^2$) | 3.8 | 3.7 | 3.6 | 4.2 | 4.1 | 4.0 | 3.2 | 3.1 | 3.0 | 3.5 | 3.4 | 3.3 | 3.8 | 3.7 | 3.6 |
| Bending Strength (kg/mm$^2$) | 5.6 | 5.5 | 5.4 | 6.2 | 6.1 | 6.0 | 5.0 | 4.9 | 4.8 | 5.3 | 5.2 | 5.1 | 5.6 | 5.5 | 5.4 |
| Bending Modulus of Elasticity (kg/mm$^2$) | 270 | 250 | 230 | 290 | 280 | 270 | 320 | 300 | 280 | 300 | 280 | 260 | 270 | 250 | 230 |
| Izod Impact Strength (kg-cm/cm) | 17 | 19 | 21 | 15 | 17 | 19 | 13 | 15 | 17 | 15 | 17 | 19 | 17 | 19 | 21 |
| Vicat Softening Point (°C.) | 80 | 75 | 72 | 82 | 80 | 75 | 80 | 75 | 72 | 77 | 75 | 70 | 80 | 75 | 72 |

TABLE 4

| | Example No. | | | | | | | | Comparative Example | | | |
|---|---|---|---|---|---|---|---|---|---|---|---|---|
| | 30 | 31 | 32 | 33 | 34 | 35 | 36 | 37 | 5 | 6 | 7 | 8 |
| Composition | | | | | | | | | | | | |
| Resin | | | | | | | | | | | | |
| Powder-form ABS Resin (wt %) | 30 | 30 | 26 | 29 | 29 | — | — | — | 34.2 | 22 | 33 | 14 |
| Powder-form MBS Resin (wt %) | — | — | — | — | — | 30 | 29 | — | — | — | — | — |
| Bead-form AS Resin (wt %) | 45 | 45 | 39 | 43 | 44 | 45 | 44 | — | 50.3 | 33 | 50 | 21 |
| Pellet-form ABS Resin (wt %) | — | — | — | — | — | — | — | 75 | — | — | — | — |
| Plasticizer | | | | | | | | | | | | |
| Di-2-ethylhexyl Phthalate (wt %) | 10 | — | 10 | 10 | 10 | 10 | 12 | 10 | 0.5 | 30 | 10 | 10 |
| Adipic Acid Polyester (wt %) | — | 10 | — | — | — | — | — | — | — | — | — | — |
| Carbon Fibers PAN Chopped Strand (wt %) | 10 | 10 | 20 | 10 | 10 | 10 | 10 | 10 | 10 | 10 | 2 | 50 |
| Carbon Black VULCAN XC-72 (wt %) | 3 | 3 | 3 | 6 | 3 | 3 | 3 | 3 | 3 | 3 | 3 | 3 |
| Antistatic Agent Alkyl Amine Base (wt %) | 2 | 2 | 2 | 2 | 4 | 2 | 2 | 2 | 2 | 2 | 2 | 2 |
| Electromagnetic Wave Shielding Effect dB | 50 | 50 | 70 | 60 | 60 | 60 | 65 | 40 | 12 | 60 | 5> | 90 |
| Property | | | | | | | | | | | | |
| Tensile Strength (kg/mm$^2$) | 4.1 | 4.5 | 3.4 | 3.7 | 4.1 | 4.0 | 3.9 | 3.3 | 4.5 | 3.7 | 4.4 | 1.3 |
| Bending Strength (kg/mm$^2$) | 6.1 | 6.7 | 5.4 | 5.7 | 6.1 | 5.9 | 5.8 | 4.9 | 6.6 | 4.4 | 6.6 | 2.2 |
| Bending Modulus of Elasticity (kg/mm$^2$) | 280 | 310 | 330 | 310 | 280 | 260 | 240 | 240 | 310 | 230 | 230 | 290 |
| Izod Impact Strength (kg-cm/cm) | 21 | 19 | 17 | 19 | 21 | 13 | 17 | 18 | 11 | 22 | 25 | 7 |
| Vicat Softening Point (°C.) | 75 | 80 | 75 | 75 | 75 | 85 | 82 | 80 | 95 | 50 | 75 | 75 |

EXAMPLE 38

Molded products were produced similarly to Example 15 while using the same resins, the same carbon black and the same antistatic agent. However, the length, diameter and bundle count of the carbon fibers used were varied as shown in Table 5. The properties of the molded products were tested similarly to the preceding Examples. The results are shown in Table 5.

TABLE 5

| | Example 38 | | | | | |
|---|---|---|---|---|---|---|
| | Run 1 | Run 2 | Run 3 | Run 4 | Run 5 | Run 6 |
| Composition | | | | | | |
| Resin | | | | | | |
| Powder-form ABS Resin (wt %) | 32 | 32 | 32 | 32 | 32 | 32 |
| Powder-form MBS Resin (wt %) | — | — | — | — | — | — |
| Bead-form AS Resin (wt %) | 48 | 48 | 48 | 48 | 48 | 48 |
| Pellet-form ABS Resin (wt %) | — | — | — | — | — | — |
| Plasticizer | | | | | | |
| Di-2-ethylhexyl Phthalate (wt %) | 5 | 5 | 5 | 5 | 5 | 5 |
| Adipic Acid Polyester (wt %) | — | — | — | — | — | — |
| Carbon Fibers PAN Chopped Strand (wt %) | 10 | 10 | 10 | 10 | 10 | 10 |
| Shape | | | | | | |
| Length (mm) | 0.2 | 30 | 6 | 6 | 6 | 6 |
| Diameter ($\mu$) | 7 | 7 | 1 | 50 | 7 | 7 |
| Bundle Count | 12000 | 12000 | 12000 | 12000 | 500 | 30000 |
| Carbon Black VULCAN XC-72 (wt %) | 3 | 3 | 3 | 3 | 3 | 3 |
| Antistatic Agent Alkyl Amine Base (wt %) | 2 | 2 | 2 | 2 | 2 | 2 |
| Electromagnetic Wave Shielding Effect (dB) | 20 | 25 | 20 | 10 | 20 | 25 |
| Property | | | | | | |
| Tensile Strength (kg/mm$^2$) | 1.4 | 1.9 | 3.1 | 3.4 | 3.4 | 3.4 |
| Bending Strength (kg/mm$^2$) | 5.0 | 6.2 | 4.5 | 6.2 | 5.0 | 6.2 |
| Bending Modulus of Elasticity (kg/mm$^2$) | 240 | 300 | 220 | 300 | 240 | 330 |
| Izod Imapct Strength (kg-cm/cm) | 15 | 9 | 13 | 15 | 17 | 9 |
| Vicat Softening Point (°C.) | 70 | 80 | 70 | 70 | 75 | 80 |

EXAMPLE 39 (RUN NOS. 1 TO 8)

The same resins and the same carbon fibers as used in Example 1 were used with a tetrabromobisphenol-A available from Teijin Kasei Limited under the Trade Name "FIREGUARD 2000", as a halogen-containing flame retarder, and antimony trioxide produced by Nippon Mining Company Limited, as an auxiliary flame-retarding agent.

Further added as a flame-retarding plasticizer of phosphoric acid derivative was tricresyl phosphate produced by Daihachi Kagahu K.K.

The compositions set forth in the following Table 6 were further supplied with an antioxidant, a stabilizer made of tribasic lead and zinc stearate, and put into a Banbury mixer heated to 140° C. to be melted and kneaded. Each of the kneaded mixture was discharged from the mixer after the temperature thereof reached 190° C., and rolled immediately between mixing rollers to form a sheet, which was cooled and then crushed into pellets.

The pellets were charged in a hopper of an 8-ounce injection molding machine to be injected into a mold for molding a housing 15 cm square and having a wall thickness of 3 mm, the mold being provided with a direct gate having a diameter of 2 mmφ.

As shown in Table 6, the thus molded products were improved in physical properties, resistance to heat and electromagnetic wave shielding effect, as well.

EXAMPLE 39 (RUN NO. 9)

The composition as set forth in Table 6 was pelletized similarly to Run No. 1 of Example 39, and the pellets were charged in a hopper of an extruder having a cylinder of 40 mm in diameter (L/D=24) to be melted and extruded through a die for forming a single layer sheet, the die being maintained at 200° C.

The die had a width of 600 mm and the lip gap was adjusted to 3.5 mm. As a result, a single layer sheet having a thickness of 3 mm was formed.

As shown in Table 6, the thus produced single layer sheet had excellent physical properties, improved resistance to heat and improved electromagnetic wave shielding effect.

EXAMPLE 39 (RUN NOS. 10 AND 11)

A powder-form MBS resin (methacrylonitrile/butadiene/styrene copolymer resin) composed of 50 wt% of methacrylonitrile, 10 wt% of butadiene and 40 wt% of styrene was used in place of the powder-form ABS copolymer resin used in Run Nos. 7 and 8. The compositions as set forth in Table 6 were pelletized similarly to Run No. 1 of Example 39, and injection molded products were produced using the thus prepared pellets. The results of tests showed that the molded products had excellent physical properties, improved resistance to heat and improved electromagnetic wave shielding effect.

EXAMPLE 39 (RUN NO. 12)

A pellet-form ABS resin (acrylonitrile/butadiene/styrene copolymer resin) composed of 20 wt% of acrylonitrile, 20 wt% of butadiene and 60 wt% of styrene was used. The composition set forth in Table 6 was pelletized similarly to Run No. 1 of Example 39, and an injection molded product was produced using the thus prepared pellets. The results of tests showed that the molded product had excellent physical properties, improved resistance to heat and improved electromagnetic wave shielding effect.

EXAMPLE 39 (RUN NO. 13)

A composition similar to that of Run No. 2 of Example 39 except in that 2-ethylhexyldiphenyl phosphate was used in place of tricresyl phosphate, was pelletized generally following to the procedures as described in Example 1. An injection molded product was produced using the thus prepared pellets, and subjected to tests. The results of the tests showed that the molded product had excellent physical properties, improved resistance to heat and improved electromagnetic wave shielding effect.

TABLE 6

| | Example 39 Run No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| Composition (wt %) | | | | | | | | | | | | | |
| Resin | | | | | | | | | | | | | |
| Powder-form ABS Resin | 18 | 20 | 14 | 21 | 15 | 20 | 18 | 20 | 20 | — | — | — | 20 |
| Powder-form MBS Resin | — | — | — | — | — | — | — | — | — | 18 | 20 | — | — |
| Bead-form AS Resin | 38 | 42 | 29 | 45 | 31 | 44 | 37 | 42 | 42 | 37 | 42 | — | 42 |
| Pellet-form ABS Resin | — | — | — | — | — | — | — | — | — | — | — | 62 | — |
| Flame-Retarding 2-Ethylhexyl Diphenyl Phosphate | — | — | — | — | — | — | — | — | — | — | — | 5 | — |
| Plasticizer Tricresyl Phosphate | 5 | 5 | 5 | 5 | 5 | 5 | 9 | 2 | 5 | 9 | 2 | 5 | — |
| Carbon Fibers PAN Chopped Strand | 15 | 15 | 10 | 15 | 35 | 10 | 15 | 15 | 15 | 15 | 15 | 15 | 15 |
| Flame Retarder Tetrabromobisphenol-A | 15 | 15 | 30 | 10 | 10 | 15 | 15 | 15 | 15 | 15 | 15 | 15 | 15 |
| Antimony Trioxide | 9 | 3 | 12 | 4 | 4 | 6 | 6 | 6 | 3 | 6 | 6 | 3 | 3 |
| Property | | | | | | | | | | | | | |
| Electromagnetic Wave Shielding Effect (dB) | 40 | 40 | 30 | 40 | 60 | 30 | 40 | 40 | 30 | 40 | 40 | 35 | 40 |
| Tensile Strength (kg/mm$^2$) | 2.7 | 3.0 | 2.4 | 3.3 | 3.3 | 3.0 | 3.0 | 3.0 | 3.6 | 3.0 | 3.0 | 2.9 | 3.0 |
| Bending Strength (kg/mm$^2$) | 4.5 | 5.0 | 4.5 | 5.0 | 6.0 | 5.0 | 4.5 | 5.5 | 5.0 | 5.0 | 5.0 | 4.5 | 5.0 |
| Bending Modulus of Elasticity (kg/mm$^2$) | 500 | 500 | 450 | 500 | 600 | 500 | 450 | 550 | 500 | 500 | 500 | 450 | 500 |
| Izod Impact Strength (kg-cm/cm) | 8 | 10 | 6 | 12 | 6 | 10 | 12 | 18 | 10 | 10 | 10 | 8 | 10 |
| Thermal Deformation Temperature (°C.) | 90 | 85 | 75 | 90 | 95 | 85 | 80 | 90 | 85 | 85 | 85 | 85 | 85 |
| Flame-Retarding Property UL-94 Combustion Test (3" bar) | V-0 | V-0 | V-0 | V-0 | V-0 | V-0 | V-0 | V-0 | V-0 | V-0 | V-0 | V-0 | V-0 |
| Oxygen Index (%) | 31 | 28 | 34 | 25 | 28 | 29 | 29 | 29 | 28 | 29 | 29 | 28 | 28 |

The properties of the molded product shown in Table 6 and other Tables were determined by the following test methods.

(1) Thermal Deformation Temperature:

The temperature was determined generally in accordance with the JIS K-7207 Method (Load-Flexure Temperature Determination Test for Rigid Plastics).

(2) UL-94 Combustion Test:

The test was conducted generally in accordance with the UL-94 Vertical Combustion Test Method.

(3) Oxygen Index:

The oxygen index was determined generally in accordance with the JIS K-7201 Method.

EXAMPLE 40 (RUN NOS. 1 TO 8)

Used as the resinous components were a powder-form ABS resin (acrylonitrile/butadiene/styrene copolymer resin) composed of 10 wt% of acrylonitrile, 50 wt% of butadiene and 40 wt% of styrene, and a bead-form AS resin (acrylonitrile/styrene copolymer resin) composed of 30 wt% of acrylonitrile and 70 wt% of styrene. Further added as an ethylene/propylene terpolymer was an ethylene/propylene/dicyclopentadiene resin produced and sold by Mitsui Petrochemical Industries, Ltd. under the Table Name "EPT-#1045".

Used as the carbon fibers were carbonized polyacrylonitrile chopped strands having a fiber length of 6 mm, a fiber diameter of $7\mu$ and a bundle count of 12,000 and available from Toho Rayon Co., Ltd. under the Trade Name "BESFIGHT HTAC6S". A tetrabromobisphenol-A available from Teijin Kasei Limited under the Trade Name "FIREGUARD 2000" was used as a halogen-containing organic flame retarder, and antimony trioxide available from Nippon Mining Company, Limited was used as an auxiliary flame-retarding agent.

To the compositions as set forth in Table 7 were further added an antioxidant, a stabilizer made of tribasic lead and zinc stearate, and the mixtures were put in a Banbury mixer heated to 140° C. Each of the compositions was discharged from the mixer after the temperature thereof reached 190° C., and processed immediately through mixing rollers to form a sheet, which was cooled and then crushed into pellets.

The pellets were charged in a hopper of an 8-ounce injection molding machine to be injected into a mold for molding a housing 15 cm square and having a wall thickness of 3 mm, the mold being provided with a direct gate having a port diameter of 2 mm$\phi$.

The thus molded products were excellent in mechanical properties, and improved in resistance to heat and electromagnetic wave shielding effect, as well.

EXAMPLE 40 (RUN NOS. 9 TO 11)

The compositions as set forth in Table 7 were pelletized similarly to Run No. 1 of Example 40, and the thus prepared pellets were charged in a hopper of an extruder having a 40 mm diameter cylinder (L/D=24) to be melted and then extruded through a die for forming a single layer sheet, the die being maintained at 200° C. The die had a width of 600 mm and the lip gap was adjusted to 3.5 mm. By pasing the molten mass through the die, a single layer sheet having a thickness of 3 mm was formed.

As shown in Table 7, the formed single layer sheets were excellent in mechanical properties and resistance to heat and improved in flame-retarding property and electromagnetic wave shielding effect.

EXAMPLE 40 (RUN NOS. 12 AND 13)

A powder-form MBS resin (methacrylonitrile/butadiene/styrene copolymer resin) composed of 50 wt% of methacrylonitrile, 10 wt% of butadiene and 40 wt% of styrene was used in place of the powder-form acrylonitrile/butadiene/styrene copolymer resin used in Run No. 1 of Example 40. The compositions as set forth in Table 7 were pelletized similarly to Run No. 1 of Example 40, and injection molded products were produced from the thus prepared pellets. The test results of the molded products showed that they were excellent in physical properties, resistance to heat, flame-retarding property and electromagnetic wave shielding effect.

EXAMPLE 40 (RUN NO. 14)

A pellet-form ABS resin (acrylonitrile/butadiene/styrene copolymer resin) composed of 20 wt% of acrylonitrile, 20 wt% of butadiene and 60 wt% of styrene was used to prepare the composition shown in Table 7. The composition was pelletized similarly to Run No. 1 of Example 40 and then molded to form an injection molded product. The properties of the molded product were tested to find that it had high mechanical strengths, excellent resistance to heat, improved flame-retarding property and improved electromagnetic wave shielding effect.

EXAMPLE 40 (RUN NOS. 15 AND 16)

An ethylene/propylene/ethylidenenorbornene terpolymer resin available from Mitsui Petrochemical Industries, Ltd. under the Trade Name "EPT-#3045" was used in place of the ethylene/propylene/dicyclopentadiene terpolymer resin used in Run No. 1 of Example 40. The compositions as set forth in Table 7 were pelletized similarly to Run No. 1 of Example 40 and then molded to form injection molded products. The properties of the molded products were tested to find that they had high mechanical strengths, excellent resistance to heat, improved flame-retarding property and improved electromagnetic wave shielding effect.

COMPARATIVE EXAMPLES 9 AND 10

Injection molded products were produced from the compositions as set forth in Table 8 generally following to the procedures as described in Run No. 1 of Example 40, one composition containing an ethylene/propylene/dicyclopentadiene terpolymer resin in an amount less than the range defined in the claims whereas the other composition containing the same terpolymer resin in an amount of more than the defined range.

The results of tests for determining the properties of the molded proucts are shown in Table 8.

COMPARATIVE EXAMPLES 11 AND 12

Injection molded products were produced from the compositions as set forth in Table 8 generally following to the procedures as described in Run No. 1 of Example 40, one composition containing carbon fibers in an amount of less than the range defined in the claims whereas the other composition containing the carbon fibers in an amount of more than the defined range.

The results of tests for determining the properties of the molded products are shown in Table 8.

The ethylene/propylene/DCPD resin appearing in Tables 7 and 8 means a terpolymer of ethylene, propylene and dicyclopentadiene, and the ethylene/propylene/ENB resin appearing in the same Tables mean a terpolymer of ethylene, propylene and ethylidenenorbornene.

TABLE 7

| | Example 40 Run No. | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |

Composition

Resin

TABLE 7-continued

| | Example 40 Run No. | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Powder-form ABS Resin (wt %) | 19 | 20 | 13 | 22 | 15 | 21 | 18 | 21 | 20 | 18 | 21 | — | — | — | 19 | 20 |
| Powder-form MBS Resin (wt %) | — | — | — | — | — | — | — | — | — | — | — | 19 | 20 | — | — | — |
| Bead-form AS Resin (wt %) | 40 | 43 | 27 | 46 | 31 | 45 | 38 | 45 | 41 | 38 | 45 | 40 | 43 | — | 40 | 43 |
| Pellet-form ABS Resin (wt %) | — | — | — | — | — | — | — | — | — | — | — | — | — | 59 | — | — |
| Ethylene/Propylene Terpolymer | | | | | | | | | | | | | | | | |
| Ethylene/propylene/DCPD Resin (wt %) | 10 | 10 | 10 | 10 | 10 | 10 | 15 | 5 | 10 | 15 | 5 | 10 | 10 | 10 | — | — |
| Ethylene/prpylene/ENB Resin (wt %) | — | — | — | — | — | — | — | — | — | — | — | — | — | — | 10 | 10 |
| Halogen-Containing Organic Flame-Retarder Tetrabromobisphenol-A (wt %) | 10 | 10 | 25 | 5 | 10 | 10 | 10 | 10 | 10 | 10 | 10 | 10 | 10 | 10 | 10 | 10 |
| Auxiliary Flame-Retarding Agent Antimony Trioxide (wt %) | 6 | 2 | 10 | 2 | 4 | 4 | 4 | 4 | 4 | 4 | 4 | 6 | 2 | 6 | 6 | 2 |
| Carbon Fibers PAN Chopped Strand (wt %) | 15 | 15 | 15 | 15 | 30 | 10 | 15 | 15 | 15 | 15 | 15 | 15 | 15 | 15 | 15 | 15 |
| Property | | | | | | | | | | | | | | | | |
| Tensile Strength (kg/mm$^2$) | 2.7 | 3.0 | 2.4 | 3.3 | 3.0 | 3.0 | 3.0 | 3.0 | 3.3 | 3.3 | 3.3 | 3.0 | 3.3 | 2.7 | 2.7 | 3.0 |
| Bending Strength (kg/mm$^2$) | 4.5 | 5.0 | 4.5 | 5.0 | 6.0 | 5.0 | 4.5 | 5.5 | 5.5 | 5.0 | 6.0 | 5.0 | 5.5 | 5.0 | 4.5 | 5.0 |
| Bending Modulus of Elasticity (kg/mm$^2$) | 450 | 500 | 450 | 500 | 600 | 500 | 450 | 550 | 550 | 500 | 600 | 500 | 550 | 500 | 450 | 500 |
| Izod Impact Strength (kg-cm/cm) | 12 | 13 | 10 | 14 | 10 | 13 | 14 | 12 | 13 | 13 | 13 | 13 | 14 | 13 | 10 | 11 |
| Thermal Deformation Temperature (°C.) | 90 | 95 | 80 | 95 | 100 | 95 | 90 | 95 | 95 | 90 | 95 | 85 | 90 | 85 | 90 | 95 |
| Flame-Retarding Property (⅛ inch bar) | V-0 | V-0 | V-0 | V-0 | V-0 | V-0 | V-0 | V-0 | V-0 | V-0 | V-1 | V-0 | V-0 | V-0 | V-0 | V-0 |
| Oxygen Index (%) | 32 | 29 | 35 | 26 | 26 | 32 | 32 | 26 | 26 | 29 | 23 | 31 | 28 | 31 | 35 | 32 |
| Electromagnetic Wave Shielding Effect (dB) | 40 | 40 | 40 | 40 | 60 | 30 | 40 | 40 | 35 | 35 | 35 | 40 | 40 | 40 | 40 | 40 |
| Molding Process | INJ | INJ | INJ | INJ | INJ | INJ | INJ | INJ | EXT | EXT | EXT | INJ | INJ | INJ | INJ | INJ |

Note: INJ in the Table means injection molding, and EXT in the Table means extrusion molding.

TABLE 8

| | Comparative Example | | | |
|---|---|---|---|---|
| | 9 | 10 | 11 | 12 |
| Composition | | | | |
| Resin | | | | |
| Powder-form ABS Resin (wt %) | 13 | 22.2 | 10 | 24 |
| Powder-form MBS Resin (wt %) | — | — | — | — |
| Bead-form AS Resin (wt %) | 28 | 48.3 | 21 | 50 |
| Pellet-form ABS Resin (wt %) | — | — | — | — |
| Ethylene/Propylene Terpolymer | | | | |
| Ethylene/propylene/DCPD Resin (wt %) | 30 | 0.5 | 10 | 10 |
| Ethylene/propylene/ENB Resin (wt %) | — | — | — | — |
| Halogen-Containing Oragnic Flame Retarder Tetrabromobisphenol-A (wt %) | 10 | 10 | 10 | 10 |
| Auxiliary Flame-Retarding Agent Antimony Trioxide (wt %) | 4 | 4 | 4 | 4 |
| Carbon Fibers PAN Chopped Strand (wt %) | 15 | 15 | 45 | 2 |
| Property | | | | |
| Tensile Strength (kg/mm$^2$) | 2.3 | 3.1 | 3.0 | 3.0 |
| Bending Strength (kg/mm$^2$) | 3.5 | 5.5 | 7.0 | 5.5 |
| Bending Modulus of Elasticity (kg/mm$^2$) | 340 | 560 | 700 | 550 |
| Izod Impact Strength (kg-cm/cm) | 20 | 8 | 4 | 12 |
| Thermal Defromation Temperature (°C.) | 65 | 100 below | 100 below | 95 |
| Flame-Retarding Property (⅛ inch bar) | V-0 | V-2 | V-2 | V-0 |
| Oxygen Index (%) | 32 | 21 | 21 above | 32 below |
| Electromagnetic Wave Shielding Effect (dB) | 43 | 37 | 70 | 10 |
| Molding Process | INJ | INJ | INJ | INJ |

Note: INJ in the Table means injection molding.

EXAMPLE 41 (RUN NOS. 1 TO 6)

Used as the resin components were a powder-form ABS resin (acrylonitrile/butadiene/styrene copolymer resin) composed of 10 wt% of acrylonitrile, 50 wt% of butadiene and 40 wt% of styrene, and a bead-form AS resin (acrylonitrile/styrene copolymer resin) composed of 30 wt% of acrylonitrile and 70 wt% of styrene. The plasticizer used was a tricresyl phosphate available from Daihachi Kagaku K.K., and the conductive filler used was the nickel-plated carbonized polyacrylonitrile chopped strands having a fiber length of 6 mm, a fiber diameter of 7μ and a bundle count of 12,000, available from Toho Rayon Co., Ltd. under the Trade Name "BESFIGHT M.C.".

1 part by weight of an antioxidant and 1 part by weight of zinc stearate were added to 100 parts by weight of the resinous components of each composition to prepare each of the compositions set forth in Table 9. Each of the compositions was put in a Banbury mixer heated to 140° C. to be mixed and kneaded. After the temperature of the mixture reached 190° C., the mixture was discharged from the mixer and then immediately rolled through mixing rollers to form a sheet, which was cooled and then crushed into pellets.

The pellets were charged in a hopper of an 8-ounce injection molding machine to be melted and then injected into a mold for molding a housing 15 cm square and having a wall thickness of 3 mm, the mold being provided with a direct gate having a port diameter of 2 mmφ.

The thus molded products had excellent physical properties, improved electromagnetic wave shielding effect, excellent resistance to heat and good appearance.

EXAMPLE 41 RUN NOS. 7 AND 8)

The compositions as set forth in Table 9 were pelletized similarly to Run No. 1 of Example 41, and the pellets were charged in a hopper of an extruder having a cylinder of 65 mm in diameter (L/D=25) to be melted and then extruded through a die for forming a single layer sheet.

The die had a width of 600 mm and the lip gap was adjusted to 3.5 mm. By passing the molten mass through the die, a single layer sheet having a thickness of 3 mm was produced.

The thus formed single layer sheets had excellent physical properties, improved electromagnetic wave shielding effect, excellent resistance to heat and good appearance, as shown in Table 9.

EXAMPLE 41 (RUN NOS. 9 AND 10)

A powder-form MBS resin (methacrylonitrile-/butadiene/styrene copolymer resin) composed of 40 wt% of methacrylonitrile, 20 wt% of butadiene and 40 wt% of styrene was used in place of the powder-form acrylonitrile/butadiene/styrene copolymer resin used in Example 41 Run Nos. 1 and 2 to prepare the compositions as set forth in Table 9. The compositions were pelletized similarly to Run No. 1 of Example 41, and injection molded products were produced from the pellets. Test results revealed that the molded products had excellent physical properties, excellent resistance to heat, improved electromagnetic wave shielding effect and good appearance.

EXAMPLE 41 (RUN NO. 11)

A pellet-form ABS resin (acrylonitrile/butadiene/styrene copolymer resin) composed of 20 wt% of acrylonitrile, 20 wt% of butadiene and 60 wt% of styrene was used to prepare the composition as set forth in Table 9. The composition was pelletized similarly to Run No. 1 of Example 41, and an injection molded product was produced from the pellets. The test results revealed that the molded product had excellent physical properties, excellent resistance to heat, improved electromagnetic wave shielding effect and good appearance.

EXAMPLE 41 (RUN NO. 12)

As shown in Table 9, copper-plated carbon fibers were used in place of the conductive filler as used in Run No. 1 of Example 41. An injection molded product was produced from the composition generally following to the procedures as described in Run No. 1 of Example 41. The test results revealed that the molded product had excellent physical properties, excellent resistance to heat, improved electromagnetic wave shielding effect and good appearance.

EXAMPLE 41 (RUN NOS. 13 AND 14)

Injection molded products were produced similarly to Run No. 1 of Example 41, except in that dioctylphthalate (DOP) produced by Daihachi Kagaku K.K. was used in place of the plasticizer used in Run No. 1 of Example 41. The compositions are shown in Table 9. The test results revealed that the molded products had excellent physical properties, excellent resistance to heat, improved electromagnetic wave shielding effect and good appearance.

COMPARATIVE EXAMPLES 13 AND 14

Injection molded products were produced similarly to Run No. 1 of Example 41, except in that one composition contained Ni-plated carbon fibers in an amount of less than the defined range whereas the other composition contained the Ni-plated carbon fibers in an amount of more than the defined range, as shown in Table 10.

The properties of the injection molded products are shown in Table 10.

COMPARATIVE EXAMPLE 15

An injection molded product was produced similarly to Run No. 1 of Example 41, except in that brass fibers available from Aisin Seiki Co., Ltd. under the Trade Name "AISIN METAL FIBER" were used in place of the conductive filler used in Run No. 1 of Example 41.

The properties of the injection molded product are shown in Table 10.

TABLE 9

| | Example 41 | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Composition (wt %) | | | | | | | | | | | | | | |
| Resin | | | | | | | | | | | | | | |
| Powder-form ABS Resin | 30 | 40 | 30 | 25 | 25 | 30 | 30 | 40 | — | — | — | 30 | 30 | 30 |
| Powder-form MBS Resin | — | — | — | — | — | — | — | — | 30 | 40 | — | — | — | — |
| Bead-form AS Resin | 50 | 45 | 45 | 45 | 35 | 30 | 50 | 40 | 50 | 40 | — | 50 | 45 | 35 |
| Pellet-form ABS Resin | — | — | — | — | — | — | — | — | — | — | 80 | — | — | — |
| Plasticizer | | | | | | | | | | | | | | |
| Tricresyl Phosphate | 5 | 5 | 10 | 15 | 5 | 20 | 5 | 5 | 5 | 5 | 5 | 5 | — | — |
| Dioctyl Phthalate | — | — | — | — | — | — | — | — | — | — | — | — | 10 | 20 |
| Conductive Filler | | | | | | | | | | | | | | |
| Ni—PLated Carbon Fibers | 15 | 10 | 15 | 15 | 35 | 20 | 15 | 15 | 15 | 15 | 15 | — | 15 | 15 |
| Cu—Plated Carbon Fibers | — | — | — | — | — | — | — | — | — | — | — | 15 | — | — |
| Carbon Fibers | — | — | — | — | — | — | — | — | — | — | — | — | — | — |
| Brass Fibers | — | — | — | — | — | — | — | — | — | — | — | — | — | — |
| Property | | | | | | | | | | | | | | |
| Electromagnetic Weave Shielding Effect (dB) | 65 | 50 | 65 | 70 | 85 | 75 | 55 | 50 | 65 | 60 | 60 | 65 | 55 | 60 |
| Tensile Strength (kg/mm$^2$) | 4.0 | 4.2 | 3.8 | 3.7 | 3.1 | 3.4 | 3.7 | 3.6 | 4.1 | 4.3 | 3.8 | 3.9 | 3.9 | 3.7 |
| Bending Strength (kg/mm$^2$) | 6.0 | 6.4 | 5.5 | 5.4 | 4.9 | 5.0 | 6.1 | 6.3 | 6.1 | 6.2 | 5.5 | 5.8 | 5.4 | 5.1 |
| Bending Modulus of Elasticity (kg/mm$^2$) | 500 | 480 | 500 | 540 | 610 | 600 | 490 | 5000 | 500 | 520 | 480 | 480 | 500 | 490 |
| Izod Impact Strength (kg-cm/cm) | 10 | 13 | 11 | 13 | 7 | 8 | 9 | 9 | 9 | 10 | 9 | 10 | 9 | 11 |
| Vicat Softening Point (°C.) | 80 | 78 | 75 | 72 | 74 | 75 | 78 | 75 | 82 | 80 | 78 | 76 | 79 | 77 |

TABLE 9-continued

| | Example 41 | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Appearance | o | o | o | o | o | o | o | o | o | o | o | o | o | o |

Note: Appearance was visually appraised. The mark o indicates that the surface is excellent in smoothness, the mark Δ indicates that the surface is fairly smooth, and the mark x indicates that the surface is rough or rugged.

TABLE 10

| | Comparative Example | | |
|---|---|---|---|
| | 13 | 14 | 15 |
| Composition (wt %) | | | |
| Resin | | | |
| Powder-form ABS Resin | 33 | 20 | 30 |
| Powder-form MBS Resin | — | — | — |
| Bead-form AS Resin | 60 | 30 | 50 |
| Pellet-form ABS Resin | — | — | — |
| Plasticizer | | | |
| Tricresyl Phosphate | 5 | 5 | 5 |
| Dioctyl Phthalate | — | — | — |
| Conductive Filler | | | |
| Ni—Plated Carbon Fibers | 2 | 45 | — |
| Cu—Plated Carbon Fibers | — | — | — |
| Carbon Fibers | — | — | — |
| Brass Fibers | — | — | 15 |
| Property | | | |
| Electromagnetic Wave Shielding Effect (dB) | 5 | 90 | 30 |
| Tensile Strength (kg/mm$^2$) | 5.0 | 2.0 | 2.8 |
| Bending Strength (kg/mm$^2$) | 7.0 | 3.2 | 4.3 |
| Bending Modulus of Elasticity (kg/mm$^2$) | 300 | 500 | 480 |
| Izod Impact Strength (kg-cm/cm) | 20 | 4 | 4 |
| Vicat Softening Point (°C.) | 82 | 75 | 75 |
| Appearance | o | x | x |

Note: Appearance was visually appraised. The mark o indicates that the surface is excellent in smoothness, the mark Δ indicates that the surface is fairly smooth, and the mark x indicates that the surface is rough or rugged.

Although the invention has been described by referring to specific examples, it should be interpreted that the present invention is not limited only to the specific examples as herein disclosed, but it is intended to embrace all modifications and alternations included in the broad scope of the invention as defined in the appended claims.

What is claimed is:

1. A resin composition having an electromagnetic wave shielding effect, comprising:
   35 to 90 wt% of a copolymer of an ethylenic unsaturated nitrile, a diene rubber and an aromatic vinyl compound or a mixture of said copolymer with another copolymer of an ethylenic unsaturated nitrile and an aromatic vinyl compound;
   1 to 25 wt% of a plasticizer;
   an electrically conductive filler consisting essentially of 5 to 25 wt% of carbon fibers with metallized surfaces; and 2 to 30 wt% of carbon black.

2. The resin composition according to claim 1, wherein said ethylenic unsaturated nitrile is selected from the group consisting of acrylonitrile, methacrylonitrile, ethacrylonitrile and methyl methacrylonitrile, said diene rubber is selected from the group consisting of butadiene, isoprene, 2-chloro-1,3-butadiene, 1-chloro-1,3-butadiene, piperylene and mixtures thereof, and said aromatic vinyl compound is selected from the group consisting of styrene, α-methylstyrene, vinyltoluene, divinylbenzene, chlorostyrene and mixtures thereof.

3. The resin composition according to claim 1, wherein said copolymer of said ethylenic unsaturated nitrile, said diene rubber and said aromatic vinyl compound is a graft copolymer prepared by graft-copolymerizing 20 to 75 parts by weight of a diene rubber or a diene-containing polymer containing not less than 50 wt% of diene rubber with 80 to 25 parts by weight of a mixture of an ethylenic unsaturated nitrile and an aromatic vinyl compound.

4. The resin composition according to claim 1, wherein said composition is a mixture of 25 to 99 parts by weight of said copolymer of said ethylenic unsaturated nitrile, said diene rubber and said aromatic vinyl compound and 1 to 75 parts by weight of said another copolymer of the ethylenic unsaturated nitrile and the aromatic vinyl compound.

5. The resin composition according to claim 1, wherein said plasticizer is selected from the group consisting of phthalic acid esters, fatty acid esters, epoxides, phosphoric acid esters, ethers, polyesters and chlorinated plasticizers.

6. The resin composition according to claim 5, wherein said phthalic acid esters are one or more of dibutyl phthalate and di-2-ethylhexyl phthalate; said fatty acid esters are one or moe of di-2-ethylhexyl adipate, dibutyl sebacate, di-2-ethylhexyl sebacate and di-2-ethylhexyl azelate; said epoxides are one or more of epoxidized fatty acid monoesters, epoxidized soybean oil and epoxidized linseed oil; said phosphoric acid esters are one or more of tricresyl phosphate, tri-2-ethylhexyl phosphate and tributoxyethyl phosphate; said ethers are one or more of triethyleneglycol di-2-ethyl butylate, dibutylcarbitol adipate and dibutylcarbitol formal; said polyesters are one or more of adipic acid polyesters, sebacic acid polyesters and azelaic acid polyesters; and said chlorinated plasticizers are one or more of chlorinated aliphatic esters and chlorinated paraffins.

7. The resin composition according to claim 1, wherein said plasticizer is selected from the group consisting of flame-retarding plasticizers of phosphoric acid derivatives and ethylene/propylene terpolymers.

8. The resin composition according to claim 7, wherein said flame-retarding plasticizers are selected from the group consisting of tri(2-ethylhexyl) phosphate, 2-ethylhexyl diphenyl phosphate, tributoxyethyl phosphate, triphenyl phosphate, cresyl diphenyl phosphate, isodecyl diphenyl phosphate, tricresyl phosphate, trixylenyl phosphate, mixed aryl phosphates, phenyl/isopropyl phenyl phosphate, mixed triaryl phosphates and tris(chloroethyl) phosphate.

9. The resin composition according to claim 7, wherein said terpolymer has a composition containing 50 to 80 mol% of ethylene, 20 to 50 mol% of propylene and 0.5 to 10 mol% of an unsaturated compound having a double bond.

10. The resin composition according to claim 9, wherein said unsaturated compound is selected from the group consisting of 1,4-hexadiene, dicyclopentadiene and ethylidene norbornene.

11. The resin composition according to claim 1, wherein each of said carbon fibers has a length of 0,.5 to 20 mm and a diameter of 3 to 25μ and said carbon fibers have a bundle count of 1,000 to 20,000.

12. The resin composition according to claim 1, further comprising 0.5 to 10 wt% of an alkylamine antistatic agent.

13. The resin composition according to claim 12, wherein said alkylamine antistatic agent is an amine compound having hydroxyethyl groups and represented by the following formula of:

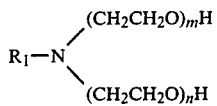

wherein $R_1$ is an alkyl or alkenyl group having 8 to 22 carbon atoms, and m and n are integers of 1 to 10.

14. The resin composition according to claim 13, wherein said amine compound is selected from the group consisting of N,N-bis( 2-hydroxyethyl) tallow amine, polyoxyethylene lauryl amine and fatty acid esters of polyoxyethylene lauryl amine.

15. The resin composition according to claim 1, further comprising 2 to 35 wt% of a halogen-containing organic flame retarder and 0.4 to 21 wt% of an auxiliary flame-retarding agent, the amount of added auxiliary flame-retarding agent being 6/10 to 2/10 of the weight of said halogen-containing organic flame retarder.

16. The resin composition according to claim 15 wherein said halogen-containing organic flame retarder is selected from the group consisting of chlorinated paraffins, tetrabromobisphenol-A and oligomers thereof, decabromobiphenyl ethers, hexabromobiphenyl ethers, pentabromobiphenyl ethers, pentabromotoluene, pentabromoethylbenzene, hexabromobenzene, pentabromophenol, tribromophenol derivatives, perchloropentanecyclodecane, hexabromocyclododecane, tris(2,3-dibromopropyl)-1)isocyanurate, tetrabromobisphenol-S and derivatives thereof, 1,2-bis(2,3,4,5,6-pentabromophenoxy)ethane, 1,2-bis(2,4,6-tribromophenoxy)ethane, brominated styrene oligomers, 2,2-bis-(4-(2,3-dibromopropyl)-3,5-dibromophenoxy)propane, tetrachlorophthalic anhydride, tetrabromophthalic anhydride and mixture thereof.

17. The resin composition according to claim 15, wherein said auxiliary flame-retarding agent is selected from the group consisting of antimony trioxide, sodium antimonate, zinc borate, and oxides and sulfides of zirconium and molybdenum.

18. The resin composition according to claim 1, further comprising any one or more of antioxidants, internal and external lubricants, and stabilizers.

* * * * *